United States Patent
Wieczorek et al.

[19]

[11] Patent Number: 6,121,138
[45] Date of Patent: Sep. 19, 2000

[54] COLLIMATED DEPOSITION OF TITANIUM ONTO A SUBSTANTIALLY VERTICAL NITRIDE SPACER SIDEWALL TO PREVENT SILICIDE BRIDGING

[75] Inventors: Karsten Wieczorek, Sunnyvale, Calif.; Fred N. Hause, Austin, Tex.

[73] Assignee: Advanced Micro Devices, Inc., Sunnyvale, Calif.

[21] Appl. No.: 09/069,014

[22] Filed: Apr. 28, 1998

[51] Int. Cl.[7] .................................................. H01L 21/44
[52] U.S. Cl. ........................ 438/682; 438/592; 438/655; 438/664; 438/680
[58] Field of Search ................................... 438/302, 303, 438/305, 592, 655, 664, 682

[56] References Cited

U.S. PATENT DOCUMENTS

| | | | |
|---|---|---|---|
| 5,496,750 | 3/1996 | Moslehi | 438/305 |
| 5,736,446 | 4/1998 | Wu | 438/305 |
| 5,739,573 | 4/1998 | Kawaguchi | 257/384 |

*Primary Examiner*—David Nelms
*Assistant Examiner*—Reneé R. Berry
*Attorney, Agent, or Firm*—Kevil L. Daffer; Conley, Rose & Tayon

[57] ABSTRACT

An integrated circuit fabrication process and transistor is provided in which salicidation is virtually eliminated from the spacer sidewall surface. Absent salicidation on that surface, bridging effects cannot occur regardless of the anneal conditions. The spacer sidewall surfaces is made substantially perpendicular to the substrate upper surface such that when a refractory metal is subsequently deposited on the semiconductor topography, the refractory metal will not accumulate on that perpendicular surface. The spacer is deposited from a specifically designed plasma enhanced chemical vapor deposition process to maintain the spacer sidewall surfaces commensurate with the gate conductor sidewall surfaces. The refractory metal is directionally deposited so that little if any metal will form on vertical surfaces and substantially all of the metal will deposit on horizontal surfaces.

11 Claims, 3 Drawing Sheets

US 6,121,138

COLLIMATED DEPOSITION OF TITANIUM ONTO A SUBSTANTIALLY VERTICAL NITRIDE SPACER SIDEWALL TO PREVENT SILICIDE BRIDGING

BACKGROUND OF THE INVENTION

1. Field of the Invention

This invention relates to semiconductor fabrication and, more particularly, to a gate conductor with opposed lateral surfaces upon which a spacer is formed having a substantially straight and vertically rising sidewall surface that is less susceptible to accumulation of a silicide-forming metal.

2. Description of Related Art

Fabrication of an integrated circuit involves numerous processing steps. After impurity regions have been deposited within a semiconductor substrate and gate areas defined upon the substrate, interconnect routing is placed on the semiconductor topography and connected to contact areas thereon to form an integrated circuit. The entire process of making an ohmic contact to the contact areas and routing interconnect material between ohmic contacts is described generally as "metallization". While materials other than metals are often used, the term metallization is generic in its application. It is derived from the origins of interconnect technology, where metals were the first conductors used. As the complexity of integrated circuits has increased, the complexity of the metallization composition has also increased.

In order to form highly conductive ohmic contacts in the connecting region or "window" between the interconnects, it is oftentimes necessary to incorporate a layer of refractory metal at the window juncture. The refractory metal, when subjected to high enough temperature, reacts with the silicon-based material in the contact window to form what is commonly called a "silicide". The unreacted metal is removed after a low resistivity silicide is at least partially formed. Silicides are well known in the art and provide dependable silicon contact as well as low ohmic resistance.

Self-aligned silicides on source/drain regions, i.e., "salicides", have increased in popularity due to the shrinking dimensions of conventional transistors. As the contact window decreases in size, it is important that contact resistance remain relatively low. Further, aligning contact windows via a separate masking step makes minimizing source/drain regions impossible. For these reasons, salicides remain a mainstay in semiconductor processing because they are good conductors and they are formed using a self-aligned process. When a metal is deposited and heated on a polysilicon gate and a silicon source/drain area, the silicide reaction occurs wherever the metal is in contact with the heavy concentration, silicon-based underlayer. However, as device dimensions shrink, so does the spacing between contact windows. Any silicide forming in light concentration areas or into areas of lateral migration must be carefully monitored and controlled. Otherwise, a phenomenon often referred to as "silicide shorting" can occur.

Silicide shorting often arises when the refractory metal is titanium and when titanium silicide is allowed to form between silicon contact windows, such as between a polysilicon gate and silicon source/drain areas, i.e., junctions. In a lightly doped drain (LDD) process, spacers normally exist on lateral surfaces of the polysilicon to separate the channel from the heavily concentrated source/drain junctions. The spacers are relatively small in size. Spacers are often made from an oxide material, and hereafter are referred to as "oxide spacers". During titanium silicide formation resulting from annealing in an inert-gas atmosphere (e.g., argon) at temperatures above 600° C., silicon diffuses into the titanium and then reacts over the oxide spacer regions. Formation of titanium silicide over the oxide spacer regions provides a capacitive-coupled or fully conductive path between the polysilicon gate conductor and the source/drain junctions.

FIGS. 1, 2 and 3 provide a better understanding of silicide shorting or bridging as it pertains to LDD technology. FIG. 1 is a top plan view of a transistor 10 comprising a gate conductor 12 which is patterned from, e.g., a polycrystalline silicon ("polysilicon") material dielectrically spaced above a substrate containing active and field regions. An active region 14 is shown surrounded by a field region. Active region 14 is adapted to receive dopants which are self-aligned to the sidewall surfaces of gate conductor 12 as well as to the field regions surrounding the active region. The dopants are those which comprise the source/drain dopants as well as the LDD dopants.

FIG. 2 indicates a cross-sectional view along plane 2—2 of FIG. 1. Specifically, transistor 10 of FIG. 1 is shown in cross section having an oxide spacer 16 arranged adjacent sidewall surfaces 18 of gate conductor 12. Spacer 16 extends laterally outward from sidewall surfaces 18 to define a spacer sidewall. Both the gate conductor sidewall 18 and the spacer 16 sidewall provide mask alignment to respective LDD area 20 and source/drain area 22. A channel 24 therefore exists within a silicon-based substrate 24 between the LDD areas 20, whereby areas 20 are doped at a lower concentration and at lesser energies than areas 22.

Substrate 24 and polysilicon 22 contain significant concentrations of silicon which migrate along paths 26 during silicide formation. The migratory avenues 26 occur primarily within a layer of refractory metal 28 deposited across the entire topography. Refractory metal 28 is typically deposited such that it covers the entire exposed topography, even the curved sidewall surface of spacer 16.

FIG. 3 illustrates a heat cycle 30 applied to the metal layer and the various materials upon which the metal layer is placed. Resulting from heat cycle 30, silicon atoms readily migrate along paths 26 shown in FIG. 2 from the silicon-rich source material across the metal layer above spacer 16 to cause bridging of the ensuing silicide 32 at spacer 16.

A popular refractory metal includes titanium which readily accepts silicon atoms derived from silicon sources, such as polysilicon gate 18 and the doped substrate 24. The stochiometric composition of oxide spacer 16 prevents substantial silicon migration through the oxide. However, the layer of titanium metal does provide a migratory avenue especially if the heat cycle is substantial.

Many researchers and manufacturers advocate a multiple step silicide formation process to help address the bridging problem. First, a refractory metal such as titanium is deposited over the entire topography. Next, the metal film is heated to a low temperature in the presence of a nitrogen ambient to form a reacted, relatively high resistance silicide in the contact windows. Next, the unreacted metal is removed using a wet chemical etch (e.g., $NH_4OH:H_2O_2:H_2O$) thereby leaving reacted metal or metal silicide in the contact windows. Finally, a higher temperature anneal is performed in order to produce a lower resistivity silicide in regions where the metal has previously reacted.

The two-step anneal process is not always successful, especially if the anneal temperature cycles are not carefully monitored and controlled. If the first anneal temperature is too high, then the oxide spacers might be partially consumed and/or silicon atoms might readily migrate into the titanium metal from the substrate or gate conductor causing undesired silicide shorting. Thus, the first anneal temperature must be carefully maintained and is highly dependent on the thickness of titanium across the spacer sidewall. Moreover, extraction of the wafer and the reacted metal silicide in the interim between the two step anneal process may place impurities or native oxides in the contact window above gate conductor 12 and source/drain region 22.

Another technique often used to prevent silicide shorting is the introduction of nitrogen during one or both anneal cycles. Nitrogen present during the first anneal step will diffuse into the titanium metal and effectively nitrate the upper surface of the metal during the same time in which the lower surface is attempted to form silicide. It is possible that the anneal temperature can be excessive and nitrogen incorporation (i.e., nitridation) can be minimal. Absent nitrogen atoms, which are used to compete with the titanium-silicide bonds formed in the silicide, extensive salicidation can occur making it difficult to remove the metal silicide from the spacer subsequent to the first anneal step.

Not only it is important to carefully control the amount of salicidation as well as nitridation, and to strike a balance between the two during the first and second anneal steps, but is also important to minimize exposure of the refractory metal to oxygen and contaminants during silicide formation. Contaminants can form between the time in which the wafer is removed from the first anneal chamber and exposed to an atmospheric environment prior to insertion into an etch chamber. Additional contaminants can occur within the etch chamber or via the etchant composition itself.

It is therefore desirable that a semiconductor fabrication process be developed which need not be concerned with placing careful controls on salicidation relative to nitridation. More specifically, a desirous process is needed whereby titanium is absent from the spacer sidewall surface altogether. Absent titanium in this critical area, silicide shorting or bridging is not present. Substantially minimizing, if not eliminating, titanium from the sidewall spacer will lessen the concerns of selecting proper anneal temperatures, two-step anneal cycles and contamination induced therefrom.

SUMMARY OF THE INVENTION

The problems outlined above are in large part solved by a fabrication process which substantially eliminates any and all refractory metals on the sidewall surface of the spacer. Void of refractory metals, the metal-covered spacer surface cannot harbor migratory silicon from silicon-rich regions. Regardless of the temperature being used, absent metal upon the spacer surface, a metal silicide cannot form. A two-step anneal therefore need not be employed since a first phase reaction, followed by a removal cycle, and then followed by a higher conductivity reaction is unnecessary. The numerous steps associated with two-step anneals, the incorporation of precise nitrogen and temperature levels during those anneals, and the risk of adding contamination or native oxides when the wafers are removed from an anneal chamber and placed within an etch chamber are avoided by the present process sequence.

Titanium is virtually eliminated from the spacer sidewall surface by employing a spacer sidewall that is substantially perpendicular to the substrate upper surface. A perpendicular spacer sidewall surface is achieved by depositing a silicide nitride ("nitride") layer using the plasma enhanced chemical vapor deposition ("PECVD") technique hereof. PECVD nitride conforms in a superior manner to the gate conductor sidewall surfaces which extend perpendicular to the substrate upper surface. Thus, the nitride maintains uniform thickness upon the gate conductor sidewall surfaces and therefore maintains the perpendicular orientation at the spacer sidewall for almost the entire spacer height. By having a spacer sidewall surface which is perpendicular for a majority of the spacer height, assurance can be given that a directionally deposited titanium layer will not accumulate on the perpendicularly oriented spacer sidewall surface.

Subsequent to forming the PECVD nitride spacer, a layer of titanium is deposited using a physical vapor deposition ("PVD") technique. Specifically, titanium is deposited in a collimated fashion using a unique form of PVD which, according to a preferred embodiment, involves sputtering a titanium target and directing the ejected atoms from the target at a perpendicular angle of incidence upon horizontal surfaces of both the gate conductor and the exposed substrate. The sputter deposition chamber and apparatus hereof are specifically designed such that deposition occurs at a faster rate perpendicular to horizontal surfaces than vertical surfaces. In fact, vertical surfaces such as the perpendicularly oriented spacer sidewall will accumulate little if any of the directed, sputtered atoms. Thus, the atoms collect in a collimated fashion primarily on horizontal surfaces only.

Absent titanium on the spacer sidewall surface, exposure to a heat cycle will not cause growth of silicide on the spacer sidewall surface adjoining the gate conductor and substrate upper surfaces. In other words, a perpendicularly oriented spacer sidewall specifically utilizing a nitride spacer will prevent segregation and migration of silicon atoms across the relatively stable, stochiometric nitride material so as to minimize any and all occurrences of silicide shorting or bridging.

Broadly speaking, the present invention contemplates a method for fabricating a metal silicide. The method includes providing a semiconductor topography which has a polysilicon gate conductor interposed laterally between a pair of silicon-based substrate regions. Nitride is deposited from a plasma source directly onto the polysilicon gate conductor and the pair of substrate regions to produce a sidewall surface of the deposited nitride which extends substantially perpendicular to an upper surface of the substrate regions. A portion of the deposited nitride is then removed at a faster rate perpendicular to the substrate than parallel to the substrate. Removal at dissimilar rates depending on surface orientation is often referred to as anisotropic removal. Anisotropic removal or etch will eventually clear the deposited nitride from an upper surface of the gate conductor and from the upper surface of the substrate region exclusive of the substrate region immediately adjacent to the polysilicon gate conductor. The retained nitride is present immediately adjacent the polysilicon gate conductor. The retained nitride comprises a nitride spacer having a sidewall surface extending substantially perpendicular to the upper surface of the substrate region. A refractory metal is then deposited in a collimated fashion at a faster rate on surfaces arranged perpendicular to the substrate than surfaces arranged parallel to the substrate. This allows the refractory metal to accumulate upon the upper surface of the polysilicon gate conductor and the upper surface of the substrate regions exclusive of the sidewall surface of the nitride spacer. The refractory metal is then annealed to form a metal silicide immediately adjacent the upper surfaces of the polysilicon gate conductor and the substrate regions.

The present invention further contemplates a transistor. The transistor comprises a substrate upper surface having a channel region laterally interposed between a source region and a drain region. A gate conductor extends between a pair of sidewall surfaces a dielectrically spaced distance above the channel region. The pair of sidewall surfaces each extends substantially perpendicular to the substrate upper surface. A nitride-based spacer may extend at a substantially uniform thickness parallel to the substrate upper surface from the pair of sidewall surfaces. A layer of titanium silicide abuts only horizontal surfaces of the gate conductor and the source and drain regions.

BRIEF DESCRIPTION OF THE DRAWINGS

Other objects and advantages of the invention will become apparent upon reading the following detailed description and upon reference to the accompanying drawings in which.

Figure 1:
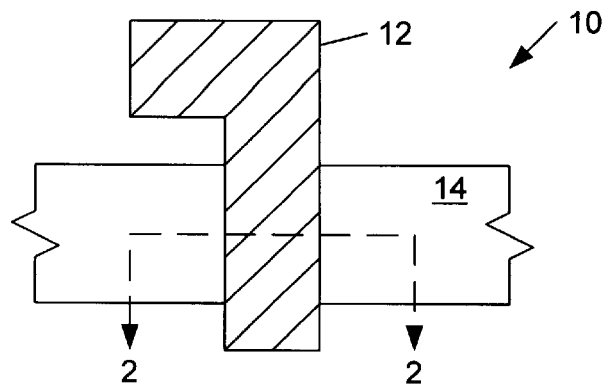
FIG. 1 is a top plan view of an MOS transistor having impurity regions placed into a substrate and self aligned to a gate conductor placed a dielectric distance above the substrate.
Figure 2:
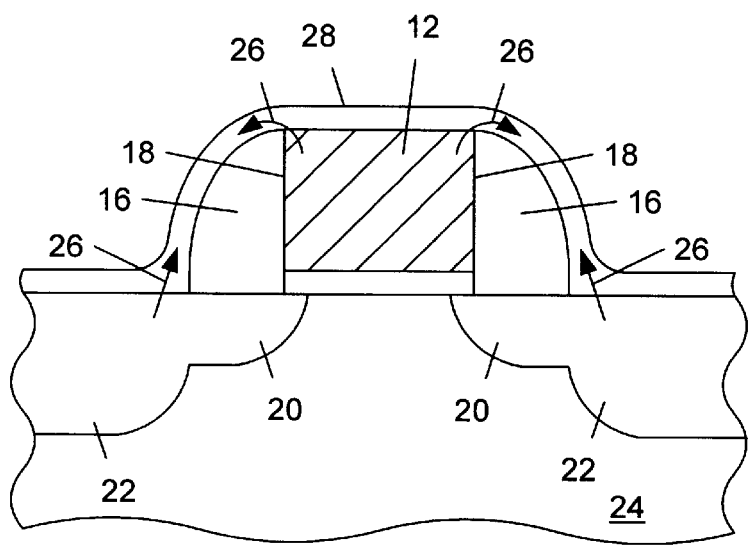
FIG. 2 is a cross-sectional view along plane 2—2 of FIG. 1, showing a refractory metal deposited upon an oxide spacer which abuts lateral surfaces of the gate conductor.
Figure 3:
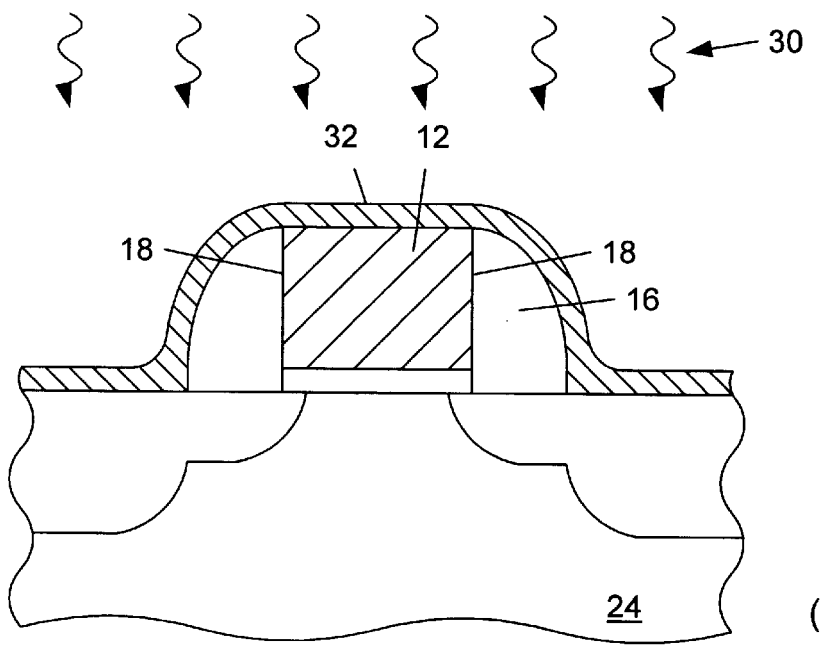
FIG. 3 is a cross-sectional view of a processing step subsequent to FIG. 2, wherein the refractory metal is shown subsequent to anneal and the conversion of the metal to a metal silicide indicative of silicide bridging between the source/drain areas and the gate conductor upper surface.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents and alternatives falling within the spirit and scope of the present invention.

DETAILED DESCRIPTION OF PREFERRED EMBODIMENTS

Figure 4:
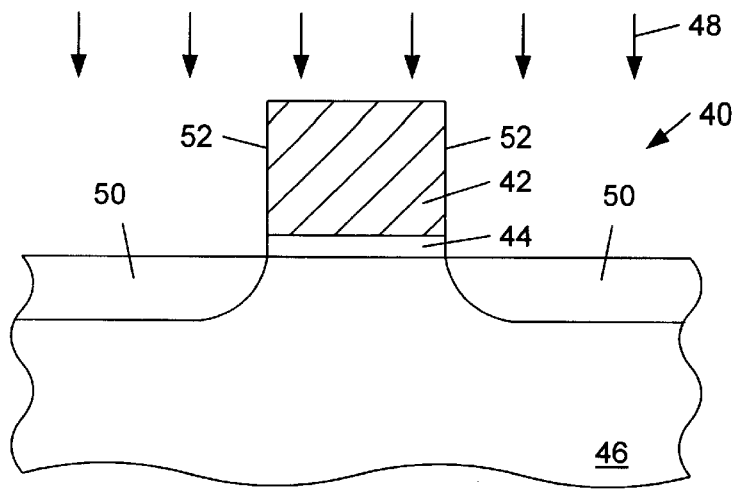
FIG. 4 is a cross-sectional view of a gate conductor used to self-align an LDD implant into the substrate according to one exemplary embodiment.

Turning to the drawings, FIG. 4 illustrates a cross-section of a semiconductor topography 40 having a gate conductor 42 and a gate dielectric 44 patterned upon a select region of a silicon-based substrate 46. Although not shown, there may be numerous isolation regions formed within substrate 46 a spaced distance from gate conductor and gate dielectric 42 and 44, respectively. The isolation regions and the gate conductor 42 serve to self align dopants 48 forwarded into substrate 46 via various well known implantation techniques.

Dopants 48 are chosen at a particular concentration and implant energy to produce an initial LDD region 50 between gate conductor 42 and the various isolation structures spaced therefrom. More specifically, the initial LDD 50 is self-aligned between the lateral edges (sidewall surfaces) 52 of gate conductor 42 and each isolation structure (not shown). LDD area 50 comprises lightly doped sections of substrate 46 on opposite sides of a channel existing directly below gate conductor 42.

Figure 5:
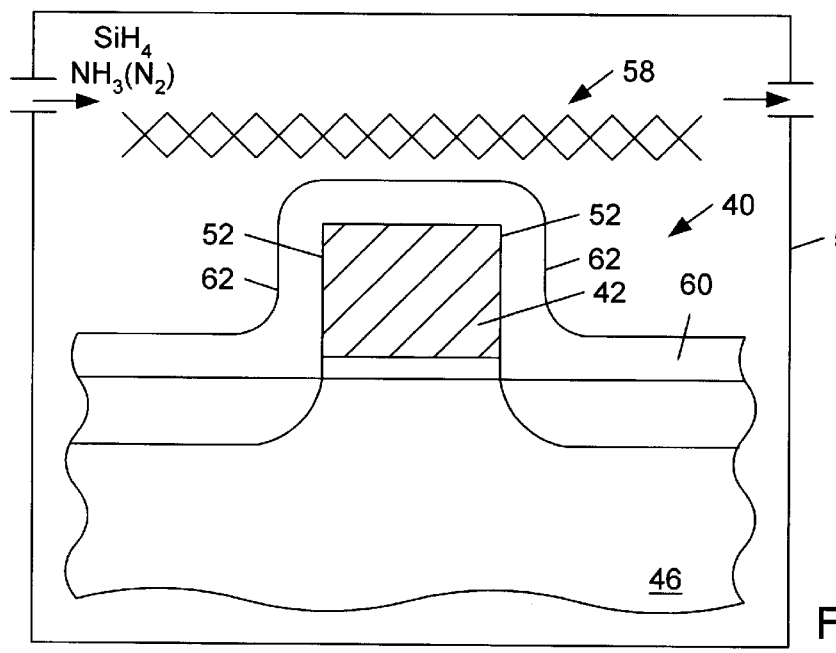
FIG. 5 is a cross-sectional view of the exposed gate conductors and LDD doped substrate of FIG. 4 receiving a PECVD nitride layer.

Referring to FIG. 5, semiconductor topography 40 is shown placed within a chamber 56. Chamber 56 is configured to receive thermal energy and to initiate and sustain a chemical reaction based on glow discharge. The glow discharge or plasma 58 transfers energy into a reactant gas by RF power applied to the low pressure reactant gas. Application of an RF field, thermal energy and low pressure creates free electrons within the discharge region of the glow discharge. The electrons gain sufficient energy from the electric field so that when they collide with gas molecules, gas-phase disassociation and ionization of the reactant gases then occurs. Preferably, the reactant gases introduced into chamber 56 comprise silane, nitrogen, ammonia or oxygen-containing species. The energized species from the reactant gases (predominantly radicals) are then adsorbed on semiconductor topography 40 as a film 60. After adsorption, the accumulated film products are subjected to ion and electron bombardment, rearrangement, reaction with other adsorbed species to form new bonds, film formation and growth. Adatom rearrangement includes the diffusion of the absorbed atoms onto stable sites and concurrent desorption of reaction products to form a highly conformal film 60.

Chamber 56 used to form plasma 58 is generally classified as a special type of plasma enhanced chemical vapor deposition ("PECVD") reactor. Chamber 56 can be arranged as a parallel plate type reactor, a horizontal tube reactor or a single wafer reactor. Film 60 is preferably a silicon nitride ("nitride") film which is substantially amorphous. Nitride is not generally known as an interlevel dielectric, and certainly not known as a film used as the sole material placed upon sidewall surfaces 52 of a gate conductor 42. This is due in part to nitride having a relatively high dielectric constant (i.e., 6 to 9 instead of approximately 4 for oxide). This makes nitride less attractive as a dielectric due to its higher capacitive coupling between adjacent conductor layers. Accordingly, nitride is generally used as a final passivation layer at the conclusion of wafer fabrication, as a mask against selective oxidation of underlying silicon, or as a gate dielectric material in high speed transistor devices, but not as an interlevel dielectric. Further, nitride is not known as the sole mechanism of an interlevel dielectric such as would be the case if nitride layer 60 is fashioned into a spacer followed by a local interconnect routed across the spacer between the gate conductor and source/drain upper surfaces to form a diode. Thus, one would not necessarily look to nitride layer 60 placed directly upon sidewall surfaces 52. In most typical instances, nitride spacers are typically placed upon an oxide, and not upon the gate conductor directly.

The use of a high dielectric spacer, such as nitride, enhances the gate fringing field effects, which in turn increases the interaction of the gate and the LDD region beyond the gate edge. Nitride spacers placed directly upon a silicon-based surface contains relatively high density of interface states, and thus to some extent exhibits poor hot-carrier resistance. A thin oxide placed between the nitride spacer and the siliconbased surface reduces this problem to some extent. However, the present process need not require an oxide intermediate layer since the intent is to maintain the vertical sidewall surface 52 at the sidewall surface 62. Any deposited or grown oxide, unless it is highly conformal, is believed to be detrimental to that result. The primary intent is for the sidewall surface 62 to be substantially perpendicular to the upper surfaces of gate conductor 42 and substrate 46. This perpendicular orientation must exist for a majority of nitride 60 step height.

To achieve a perpendicular sidewall surface 62, silane ($SiH_4$) is reacted with ammonia ($NH_3$) or nitrogen gas ($N_2$) to form a non-stochiometric silicon nitride (i.e., $Si_xN_yH_z$) with hydrogen byproduct. The hydrogen byproduct may be partially added to the nitride film having a hydrogen content within the film exceeding, for example, 80% atomic weight. While ammonia disassociates much more readily than nitrogen, ammonia produces greater hydrogen content within the nitride. Large amounts of hydrogen bonded with silicon in the nitride structure may cause significant threshold shifts within LDD regions 50 adjacent the channel.

According to another exemplary embodiment, PECVD nitride 60 can be deposited upon sidewall surfaces 52 with a slight re-entrant angle. If surfaces 52 are tapered, whereby the base of gate conductor 42 is wider than the upper elevations then, to compensate for that taper, nitride 60 can be deposited with a re-entrant angle. To achieve the re-entrant angle, nitride 60 deposits on the sidewall surfaces to a greater extent near the upper elevations of surfaces 52 than at the lower, or base elevations.

Of importance is the lower temperature at which the PECVD nitride 60 can be deposited relative to other CVD techniques. Namely, PECVD nitride can be deposited between 350° C. to 450° C., rather than the higher temperature CVD processes which involve temperatures exceeding, for example, 650° C. Thus, the previously placed LDD implant 50 does not substantially diffuse from its implanted position when PECVD is applied. Accordingly, the integrity of the channel is maintained.

Figure 6:
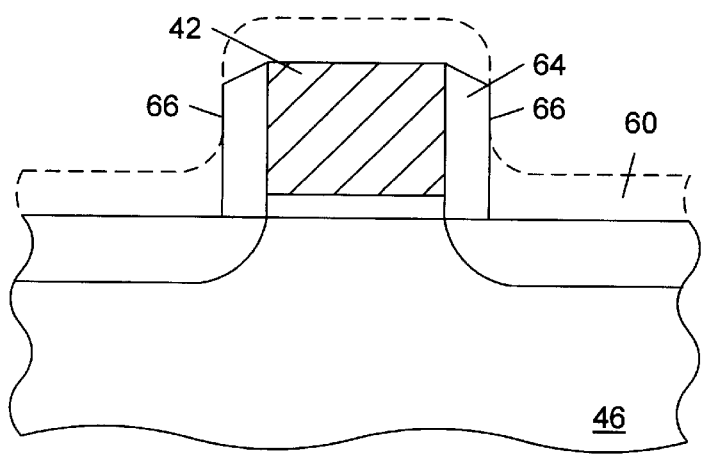
FIG. 6 is a cross-sectional view of the nitride layer of FIG. 5 being removed from horizontal surfaces by an anisotropic etch to form nitride spacers having a sidewall surface which is substantially vertical and/or perpendicular to the substrate upper surface.

FIG. 6 indicates clearing of nitride layer 60 from horizontal surfaces. An anisotropic etch using a plasma source, generally recognized as a dry etch, is preferably applied. The anisotropic etch removes nitride 60 at a faster rate along a perpendicular axis rather than a parallel axis relative to the horizontal surfaces. If the plasma etch is allowed to continue, nitride 60 will be cleared from all the horizontal surfaces except for those immediately adjacent a vertical surface. The etch byproduct of silicon will provide indication of etch stop. The remaining portion of nitride layer 60 is shown as nitride spacer 64. Nitride spacer 64 includes a sidewall surface 66 maintained from the perpendicular sidewall surface 62. Spacer sidewall surface 66 extends perpendicular for a majority of the thickness of gate conductor 42.

Figure 7:
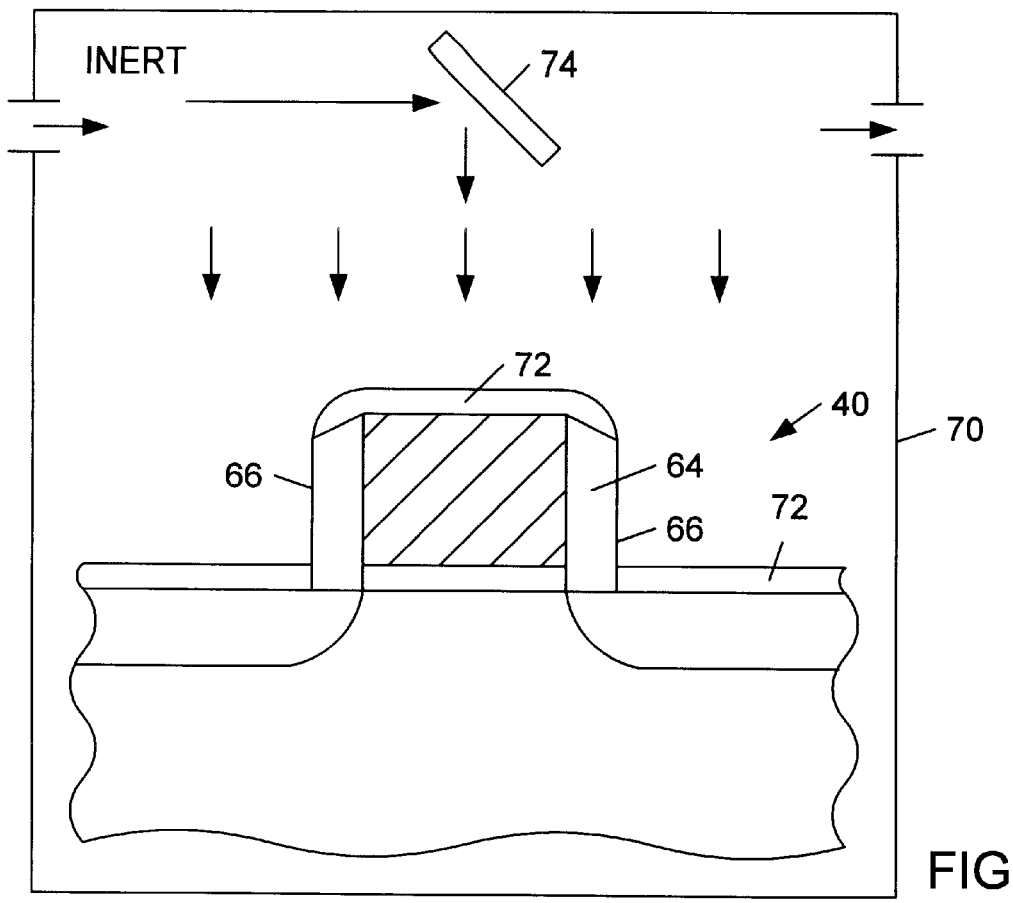
FIG. 7 is a cross-sectional view of exposed horizontal surfaces of the gate conductor, spacers and substrate of FIG. 6 receiving a collimated refractory metal.

FIG. 7 illustrates a physical vapor deposition ("PVD") chamber 70 used to deposit a refractory metal 72, preferably titanium, according to one example. Titanium can be deposited from various PVD techniques, including a sputter deposition system whereby a titanium-based target 74 is bombarded by atoms, ions, or molecules derived from energized inert species. The kinetic energy of the impinging particles causes the surface of target 74 to be dislodged and ejected into a gas phase above topography 40. Biasing the gas phase relative to topography 40 causes the ablated particles to be ejected and thereafter directed at an angle of incidence perpendicular to topography 40 horizontal surfaces. More specifically, the ejected particles deposit upon horizontal surfaces in a collimated fashion. To accomplish collimated deposition, target 74 and topography 40 are closely spaced, preferably less than 8.0 cm apart. The mean free path of the sputtered atoms is thereby relatively short to allow the sputtered or ejected atoms to arrive at topography 40 with reduced energy. It is postulated a reduction in the mean free path to more accurately bias the lower energized sputtered gas atoms at an angle perpendicular to the topography horizontal surfaces. In addition to the sputtered atoms, other species are also transported to topography 40, including negative ions and high energy electrons, both of which are directed by the bias energy between target 42 and topography 40. The directed (charged) ions and electrons carry with it the sputtered atoms, which are in large part, neutral. The bias applied between target 74, the chamber wall, and topography 40 may be applied, if desired, as DC biased energy.

A directionally applied titanium film 72 ensures that it accumulates only on horizontal surfaces. If spacer sidewall surfaces 66 are indeed perpendicular (or vertical) then little if any accumulation of titanium will occur on those surfaces. However, if the spacer sidewall surfaces 66 are not perfectly perpendicular and some titanium accumulates on those surfaces, then the present process may include an isotropic etch which removes the thin layer of titanium on those sidewall surfaces. That thin layer will also be removed on horizontal surfaces. However, due to the large disparity in thickness between horizontal and vertical surfaces, removal of some titanium from the horizontal surfaces will be negligible compared to its overall thickness. For example, if sidewall surfaces 66 are less than 10° from perpendicular, then it is postulated approximately 20 to 60 angstroms of titanium will deposit on those sidewall surfaces if 600 angstroms are targeted for the horizontal surfaces. Titanium (e.g., 20 to 60 angstroms) can be readily removed from the spacers using an isotropic etch which would only remove a small percentage of the overall thickness of the horizontally deposited titanium.

Figure 8:
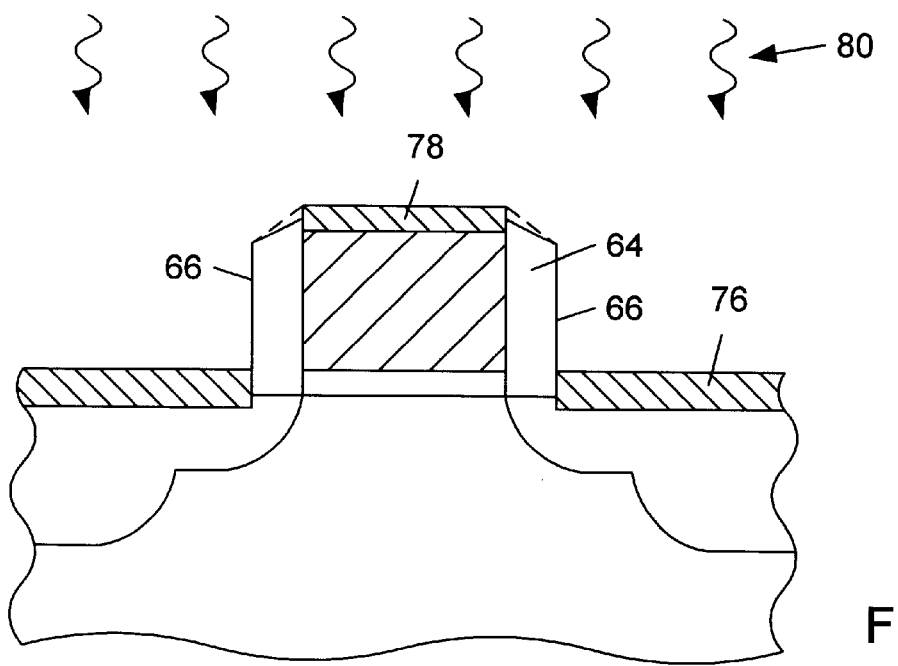
FIG. 8 is a cross-sectional view of silicide formed at the interface between the refractory metal and horizontal surfaces on which the metal was deposited in FIG. 7.

FIG. 8 illustrates a subsequent step of salicidation. Preferably, salicidation can occur in a single anneal cycle. Anneal is carried out by placing topography 40, containing the titanium deposited layer, into an anneal chamber and heating the ambient within that chamber to a relatively high temperature, preferably between 700° C. to 780° C. Temperatures obtained through a rapid thermal anneal ("RTA") configuration for less than a minute forms titanium silicide in stochiometric proportions having a resistivity of approximately 15 micro ohms-cm above the substrate and approximately 13 micro ohms-cm over the polysilicon gate conductor. The various silicides formed in those regions are shown in FIG. 8 as reference numerals 76 and 78, respectively. The heat cycle used to perform the single step anneal is shown as reference numeral 80. Preferably, anneal is performed in an inert ambient, such as argon, however, nitrogen ambient may be used if additional grain stuffing is needed. However, since titanium is not present on sidewall surfaces 66, nitrogen need not be applied during anneal since stuffing is not needed.

If desired, anneal temperatures can be increased above 800° C. in a single heating cycle to further reduce resistivities of the silicide without suffering the effects of silicide formation on the spacer sidewall surfaces. In fact, extremely high temperatures can be used to effectuate salicidation since silicon growth avenues are not present on the sidewall surfaces. The only limitation as to the anneal temperature is diffusivity of the LDD and source/drain dopants within the substrate. Accordingly, those dopants have a thermal budget which, when placed, must generally remain in their implanted position so as not to further skew the threshold (turn on) leakage and turn off characteristics of the ensuing transistor. It is noted that FIG. 7 illustrates the source/drain implant profile placed within the substrate prior to subjecting topography 40 to titanium deposition. Accordingly, a step is present between FIGS. 6 and 7 indicative of the source/drain implant using spacer 64 and gate conductor 42 as a source/drain implant mask.

It will be appreciated to those skilled in the art having the benefit of this disclosure that this invention is capable of forming vertically oriented sidewalls surfaces of a nitride spacer deposited directly upon the lateral surfaces of the gate conductor. The spacer sidewall surfaces ensure that directionally deposited titanium does not accumulate thereon. This is particularly useful to prevent salicidation and bridging effects on the spacer between contact windows comprising the gate conductor upper surface and the source/drain upper surface. Various modifications and changes may be made to each and every processing step as would be obvious to a person skilled in the art having the benefit of this disclosure. It is intended that the following claims be interpreted to embrace all such modifications and changes, and accordingly, the specification and drawings are to be regarded in an illustrative rather than a restrictive sense.

What is claimed is:

1. A method for fabricating a metal silicide, comprising:

forming a polysilicon gate conductor interposed laterally between a pair of silicon-based substrate regions;

depositing nitride from a plasma source directly onto the polysilicon gate conductor and the pair of substrate regions to produce a sidewall surface of the deposited nitride extending substantially perpendicular to an upper surface of the substrate regions;

removing a portion of the deposited nitride at a faster rate perpendicular to the substrate than parallel to the substrate, to clear the deposited nitride from an upper surface of the gate conductor and from the upper surface of the substrate regions exclusive of the substrate region immediately adjacent the polysilicon gate conductor, and to retain the deposited nitride as a nitride spacer immediately adjacent the polysilicon gate conductor, said retained deposited nitride comprising a nitride spacer having a sidewall surface extending substantially perpendicular to the upper surface of the substrate region;

depositing a refractory metal in a collimated fashion at a faster rate perpendicular to the substrate than parallel to the substrate to allow said refractory metal to accumulate upon the upper surface of the polysilicon gate conductor and the upper surface of the substrate regions exclusive of the sidewall surface of the nitride spacer; and annealing said refractory metal to form a metal silicide immediately adjacent the upper surfaces of the polysilicon gate conductor and the substrate regions.

2. The method as recited in claim 1, wherein said depositing nitride comprises deposition within a plasma enhanced chemical vapor deposition chamber.

3. The method as recited in claim 1, wherein said deposited nitride is substantially conformal with the underlying polysilicon gate conductor and substrate regions.

4. The method as recited in claim 1, wherein said deposited nitride extending vertically from the upper surfaces of the polysilicon gate conductor is substantially the same thickness as the deposited nitride extending horizontally from a sidewall of the polysilicon gate conductor.

5. The method as recited in claim 1, wherein said removing comprises anisotropically removing a portion of the deposited nitride using a plasma etchant.

6. The method as recited in claim 1, wherein said depositing refractory metal comprises physical vapor depositing titanium.

7. The method as recited in claim 1, wherein said depositing refractory metal comprises sputter depositing titanium.

8. The method as recited in claim 1, wherein said annealing comprises forming the silicide using a single heat cycle.

9. The method as recited in claim 1, wherein said annealing occurs using less than two heat cycles.

10. The method as recited in claim 1, further comprising performing an isotropic etch subsequent to said depositing a refractory metal, to substantially remove any accumulation of said refractory metal on said sidewall surface.

11. The method of claim 1, wherein forming a polysilicon gate conductor interposed laterally between a pair of silicon-based substrate regions comprises forming a gate dielectric beneath said polysilicon gate conductor.

\* \* \* \* \*